US009459640B2

(12) United States Patent
Courteille et al.

(10) Patent No.: US 9,459,640 B2
(45) Date of Patent: Oct. 4, 2016

(54) REDUNDANT ELECTRIC CIRCUIT FOR CUTTING OFF THE POWER SUPPLY TO A PIECE OF EQUIPMENT

(71) Applicant: Sagem Defense Securite, Boulogne-Billancourt (FR)

(72) Inventors: Jean-Marie Courteille, Boulogne-Billancourt (FR); Patrick Valette, Boulogne-Billancourt (FR); Francois Guillot, Boulogne-Billancourt (FR); Sonia Schindler, Boulogne-Billancourt (FR)

(73) Assignee: SAGEM DEFENSE SECURITE, Boulogne-Billancourt (FR)

( * ) Notice: Subject to any disclaimer, the term of this patent is extended or adjusted under 35 U.S.C. 154(b) by 0 days.

(21) Appl. No.: 14/651,200

(22) PCT Filed: Dec. 11, 2013

(86) PCT No.: PCT/EP2013/076170
§ 371 (c)(1),
(2) Date: Jun. 10, 2015

(87) PCT Pub. No.: WO2014/090849
PCT Pub. Date: Jun. 19, 2014

(65) Prior Publication Data
US 2015/0309519 A1 Oct. 29, 2015

(30) Foreign Application Priority Data
Dec. 11, 2012 (FR) ...................................... 12 61900

(51) Int. Cl.
*G05F 1/575* (2006.01)
*G05F 1/56* (2006.01)
*H03K 19/007* (2006.01)

(52) U.S. Cl.
CPC ............. *G05F 1/56* (2013.01); *H03K 19/0075* (2013.01)

(58) Field of Classification Search
CPC .... H02M 3/156; H02M 3/158; H02M 3/155; H02M 3/157; G05F 1/569; G05F 1/575; G05F 1/156
USPC ................................ 323/276, 280, 282, 283
See application file for complete search history.

(56) References Cited

U.S. PATENT DOCUMENTS

| 4,868,826 A | 9/1989 | Smith et al. | |
| 7,304,406 B2 * | 12/2007 | Behringer | H01H 47/005 307/326 |
| 8,203,234 B2 * | 6/2012 | Lee | H02J 7/0031 307/326 |

(Continued)

FOREIGN PATENT DOCUMENTS

| DE | 198 57 396 A1 | 6/2000 |
| EP | 1 286 266 A2 | 2/2003 |

OTHER PUBLICATIONS

International Search Report dated Feb. 19, 2014.

*Primary Examiner* — Adolf Berhane
(74) *Attorney, Agent, or Firm* — Blakely Sokoloff Taylor & Zafman LLP

(57) ABSTRACT

The invention concerns an electric circuit designed to control a power supply of a piece of electrical equipment, the electric circuit comprising a piece of electrical equipment and a source of supply voltage, and further having, as inputs, at least two discrete electrical signals of which the values condition the cutting off of the power supply to the piece of equipment, the circuit being characterized in that it further comprises:—a module for the redundant comparison of the discrete electric signals, comprising two branches for comparing said signals, parallel to one other, each branch being designed to supply, at the output, a control signal representative of each of the comparisons of said discrete electrical signals, and—a first module for cutting off the power supply to the piece of electrical equipment comprising two switches in series, each one being controlled respectively by one of the two control signals. The invention also concerns a system for acquiring, processing and communicating avionics data installed in an aircraft, comprising such an electric circuit.

8 Claims, 2 Drawing Sheets

(56) References Cited

U.S. PATENT DOCUMENTS

Figure 1:
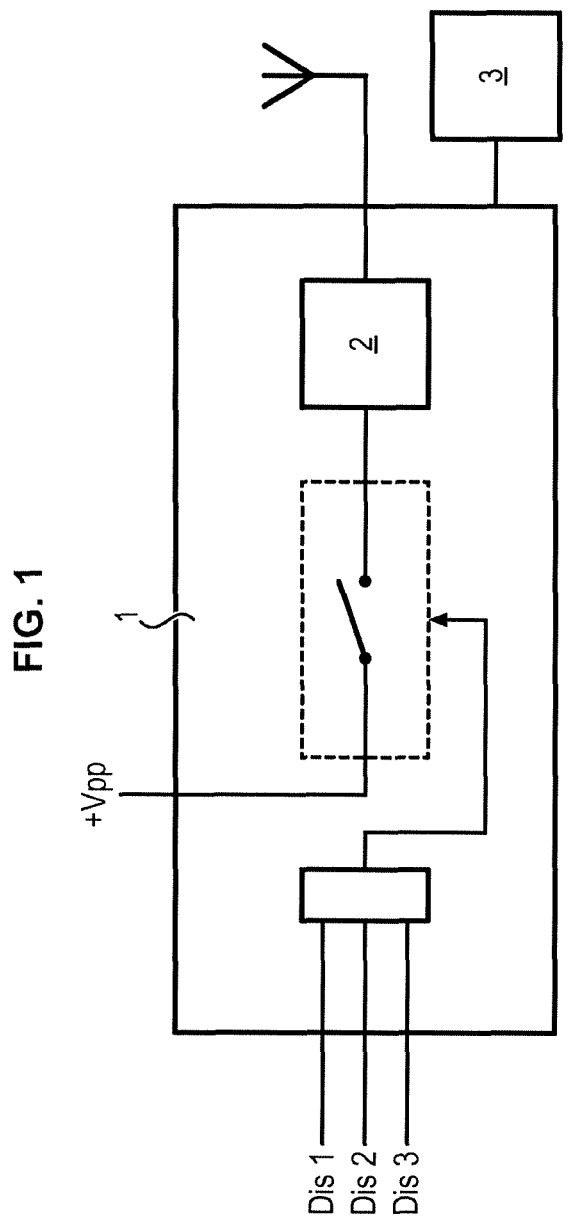

| | | | |
|---|---|---|---|
| 8,829,716 B2 * | 9/2014 | Tinglow | H02J 7/0016 307/65 |
| 9,257,831 B2 * | 2/2016 | Valette | H02H 3/202 |
| 9,276,395 B2 * | 3/2016 | Valette | H02J 1/08 |
| 2015/0165989 A1 * | 6/2015 | Valette | B60R 16/03 307/9.1 |

* cited by examiner

REDUNDANT ELECTRIC CIRCUIT FOR CUTTING OFF THE POWER SUPPLY TO A PIECE OF EQUIPMENT

GENERAL TECHNICAL FIELD

The invention relates to the domain of safety in control of systems or equipment, particularly electronic systems or equivalent, and particularly systems or equipment onboard on aircraft.

STATE OF THE ART

An electrical system may be controlled after a condition has been satisfied.

One known solution is to connect the power supply of the electrical system to an electric circuit configured to test discrete signals indicating that the condition is satisfied.

For example, in the case of an aircraft, some electrical equipment has to be cut off in flight, for example in the case of an avionics data acquisition, processing and communication system, the wireless radio transmission module must be cut off to not disturb operation of the aircraft.

The power supply to the radio module can be cut off if necessary by means of logical AND gates connected to switches.

However, such a solution is not satisfactory when particularly high safety levels are required. For example, the required safety levels for the power supply to electrical equipment with a catastrophic risk, in other words that could potentially lead to the loss of human lives, are of the order of $10^{-9}$ per hour of flight.

PRESENTATION OF THE INVENTION

The invention discloses a means to mitigate at least one of these disadvantages.

To achieve this, the invention discloses an electric circuit adapted to controlling an electrical power supply of a piece of electrical equipment, the electric circuit comprising electrical equipment and a power supply voltage source, and also having at least two discrete electrical signals as inputs, which values control cutting off of the electrical power supply of the equipment, the circuit being characterised in that it also comprises:

- a redundant comparison module that compares discrete electrical signals, comprising two comparison branches of said signals in parallel with each other, each branch being adapted to provide an output control signal representative of each of the comparisons of said discrete electrical signals, and
- a first cut off module that cuts off the electrical power supply to the electrical equipment comprising two switches in series, each of which is controlled by one of the two control signals.

The invention is advantageously extended by the following characteristics taken alone or in any of their technically possible combinations:

- the electric circuit also comprises a second module to cut off the electrical power supply of the electrical equipment connected in series between the power supply voltage source to the electrical equipment and the first cut off module, the first cut off module being controlled by control signals output from the redundant comparison module,
- the second electrical power supply cut off module is adapted to isolate the electrical equipment from the power supply source by generating a short circuit if there is a difference between the control signals output from the redundant comparison module,
- parallel branches of the redundant discrete input signals comparison module make a comparison between said signals by the use of a positive logic and a negative logic respectively,
- the electric circuit also comprises a first module to verify the power supply voltage to said circuit,
- the electric circuit also comprises a module to compare control signals and discrete signals from each branch,
- the electric circuit also comprises a second module that verifies outputs from the comparison module and the first module that verifies the voltage and compares control signals and discrete signals, said second verification module having a discrete synthetic variable as its output,
- the circuit has three discrete electrical input signals.

The invention also discloses an avionics data acquisition, processing and communication system onboard an aircraft, comprising an electric circuit according to the invention in which the electrical equipment is an avionics data remote communication module and the discrete input signals are signals related to the state of said aircraft, the electric circuit being adapted to supply electrical power to the remote avionics data communication module when all electric input signals indicate that said aircraft is stopped and is on the ground.

Advantageously but optionally, the system according to the invention may also have the following characteristics: the electric circuit also comprises a central module for acquisition of at least one of the data among the following group:

- values of control signals output from the comparison module,
- discrete synthetic value,
- state of switches,
- state of the input signal to the remote avionics data communication equipment,
- operating state of the remote communication equipment, the system also comprising a device for signalling data acquired by the central acquisition module.

Therefore, an electric circuit with several redundant levels is disclosed; thus, the following are made redundant:

- comparisons of discrete electric input signals,
- control signals output from said comparisons, and
- controls to cut off the electrical power supply to the remote data transmission equipment.

These multiple redundancies can minimise the impact of the failure of an individual electronic component and reduce the probability that the electrical equipment is powered when it should not be powered to less than $10^{-9}$ per hour of flight.

An electrical power supply cut off module also guarantees that a failure of an electronic component will not cause unwanted electrical power supply.

PRESENTATION OF THE FIGURES

Figure 2:
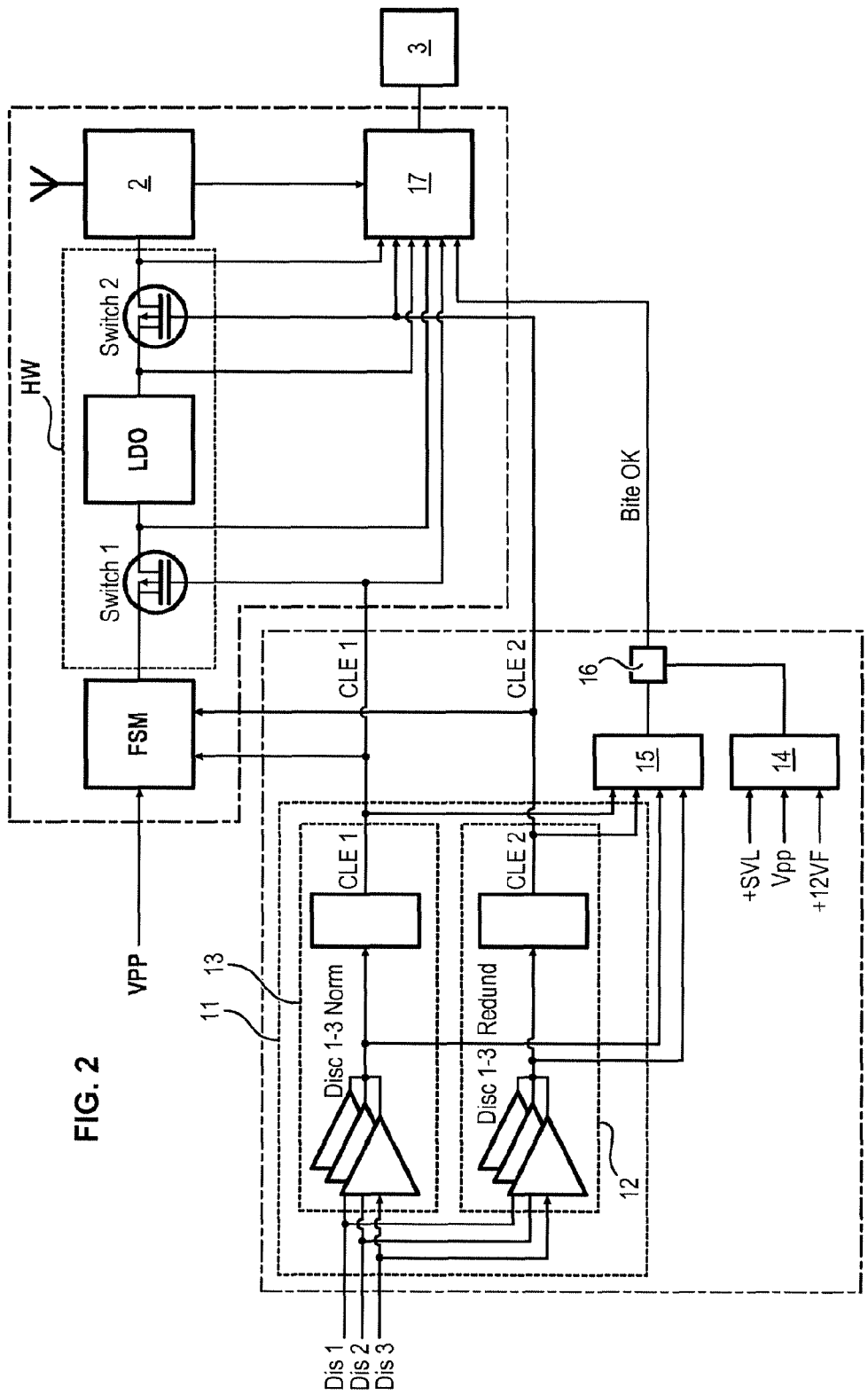

Other characteristics, purposes and advantages of the invention will become clear after reading the following purely illustrative and non-limitative description that should be read with reference to the appended drawings in which:

FIG. 1 shows an avionics data acquisition, processing and communication system according to one embodiment of the invention, FIG. 2 shows a principle diagram for an electric circuit conforming with one embodiment of the invention.

DETAILED DESCRIPTION OF ONE EMBODIMENT OF THE INVENTION

With reference to FIG. 1, an avionics data acquisition, processing and communication system comprises:
an acquisition unit (not shown) for acquisition of discrete electrical signals DIS1, DIS2, DIS3 indicating a state of the aircraft;
an electric circuit 1 comprising:
a radio module 2 adapted to transfer avionics data from the system to a remote station;
a power supply voltage source +Vpp for the radio module 2,
the electric circuit being adapted to control the electrical power supply to the module 2, by cutting off the power supply to the radio module when the aircraft is in flight, and
a device 3 for signalling information about the electric circuit 1 and avionics data to be communicated. This signalling device may be a display unit, a printer or any other means of communicating with an external avionics system.

One state of the aircraft will be for example in flight, on the ground, etc. When the aircraft is on the ground, examples of discrete electrical signals indicating that the aircraft is stopped are a signal indicating that there is a weight of the aircraft on the wheels, a signal indicating that the aircraft engines are stopped, or a signal indicating that the aircraft doors are open, etc.

The electrical power supply circuit may be modelled by a switch controlled by a logical function of discrete electrical signals (see FIG. 1).

It should be understood that a logical function refers to a set of logical operations with one or several variables. Known logical functions are AND, OR, exclusive OR (XOR), etc.

With reference to FIG. 2, input received by the electric circuit 1 consists of at least two discrete electrical signals and preferably three discrete electrical signals DIS1, DIS2, DIS3 or more as input, and comprises a voltage source +Vpp. The values of discrete electrical signals control the electrical power supply of the radio module 2.

In order for the radio module 2 to be powered, all the discrete electrical signals DIS1, DIS2, DIS3 have to be equal to each other, the logical value 1 or 0 of each discrete electrical signal corresponding to a state in which the aircraft is on the ground according to the convention chosen.

Obviously, it would be possible to envisage an electric circuit with input consisting of a larger number of discrete electrical signals.

As a non-limitative example, in the remaining description it will be considered that all three discrete electrical signals must be equal to 1 before the electrical equipment can be powered.

As described in the following, if only one component is used to test the values of the discrete electrical signals, this component will have a non-negligible probability of failure such that there is a non-negligible probability that the electrical equipment is powered when it should not be powered.

To overcome this problem, the electric circuit makes redundant comparisons of the discrete electrical signals, to guard against a component failure. This can reduce the probability of the electrical equipment being powered when it should not be powered.

The probability of failure of the circuit needs to be of the order of $10^{-9}$, while an electronic component alone has a probability of failure of the order of $10^{-6}$.

The electric circuit 1 comprises a module 11 for making a redundant comparison between the discrete electrical signals DIS1, DIS2, DIS3. The comparison module 11 comprises two signal comparison branches 12, 13 in parallel, each branch comprising a logical function using the discrete electrical signals as input—in other words acquiring and adapting a physical interface with the external environment and adapted to produce a corresponding control signal CLE 1, CLE 2 as output, representative of the comparison between said discrete electrical input signals.

For example, a comparison branch may use the AND logical function between the discrete electrical signals, such that the output control signal is equal to 1 only if all discrete electrical signals are equal to 1.

Advantageously but not limitatively, the logical functions used by the two branches 12, 13 that compare discrete signals are distinct, so that a comparison is obtained by two different ways.

For example, the logical function of one of the branches uses a positive logic, in other words a comparison between the discretes themselves (element DISC1-3 Norm in FIG. 2), and the other logical function uses a negative logic, in other words a comparison between the inverses of the discretes (element DISC1-3 Redund in FIG. 2).

As will have been understood, the comparison module 11 therefore makes the comparison of discrete signals redundant.

If the control signals CLE 1, CLE 2 at the output from each branch of the comparison module 11 are equal (for example if they are equal to 1) representing normal operation, the opposite case corresponds to a malfunction in one of the branches of the comparison module 11.

Still with reference to FIG. 2, the electric circuit 1 comprises a first cut off module HW to cut off the electrical power supply to the equipment 2, this module being controlled by control signals CLE 1, CLE 2 output from the comparison module 11 on the input side.

This first cut off module HW comprises two switches in series Switch1, Switch2 placed between the power supply Vpp and the electrical equipment 2, each of the two switches being controlled by one of the two control signals CLE 1, CLE 2 respectively.

Therefore the first cut off module HW can make the command output from control signals CLE 1, CLE 2 redundant. The electrical equipment cannot be powered unless the two control signals are equal and particularly in the example presented above, each of the control signals CLE 1, CLE 2 has to be equal to 1.

However, if the values of the control signals are different following a malfunction of an electronic component, the electrical equipment is not powered.

Due to this redundancy of the command derived from the comparison of discretes, failure of an electronic component is less likely to initiate power supply to the electrical equipment 2. In other words, the probability that the electrical equipment 2 is powered when it should not be powered, is lower.

As can be seen in FIG. 2, the electric circuit 1 also comprises a second cut off module FSM (FailSafe Monitoring) that guarantees that a malfunction of an electronic component does not create any danger for the aircraft, and particularly that such a malfunction cannot cause the risk of supplying power to the electronic equipment 2 when it should not be powered.

This second cut off module FSM is connected in series between the power supply voltage source Vpp of the electrical equipment 2 and the first cut off module HW.

The second cut off module FSM is controlled particularly by two control signals CLE 1, CLE 2 output from the discrete input signals comparison module 11.

The second cut off module FSM is adapted to enable power supply to the electrical equipment only if the values of the two control signals CLE 1, CLE are equivalent and correspond to values of all discretes corresponding to a state of the aircraft "on the ground".

Reconsidering the above example, the second cut off module FSM only enables power supply to the electrical equipment if the two control signals CLE 1, CLE 2 are equal to 1.

Furthermore, another function of the second cut off module FSM is to detect a malfunction in components of the discrete comparison module 11. In this respect, if the values of the control signals are different, the module isolates the electrical equipment from the power supply source Vpp by generating a short circuit. In this respect, the cut off module FSM can destroy an isolating device such as a fuse or a circuit breaker.

Consequently, due to the first and second cut off modules HW, FSM, the cut off of the power supply Vpp controlled by the control signals CLE 1, CLE 2 is itself redundant, which reduces the probability of failure of the electric circuit 1.

Additionally, the first cut off module HW may include a voltage regulator LDO placed between the first switch Switch1 and the second switch to adapt the value of the input voltage to the signal device 3.

Also complementarily, the electric circuit 1 is connected to an information signalling device 3 related to the state of the electric circuit and to avionics data.

In this respect, the electric circuit 1 comprises a comparison module 15 that compares firstly the redundant values of discrete input signals, and secondly the redundant values of control signals CLE 1, CLE 2.

Therefore, the input to this module consists of:
  values of discretes DISC1-3 Norm and DISC1-3 Redund in the two branches 12, 13 of the comparison module 11 that it compares in pairs, and
  values of control signals CLE 1, CLE 2 derived from the comparison of the discretes that it compares in pairs.

As output, it generates information indicating if the compared data are correct, for example 1 if all the items of redundant information are consistent with each other, and otherwise 0.

The circuit 1 also comprises a first verification module 14 that verifies values of voltages in the circuit. It checks the value of the power supply voltage of modules 13 and 15 that must for example be equal to 5V, the value of the power supply voltage of discrete acquisition interfaces in modules 12 and 13 that must for example be equal to 12V, and the value of the power supply voltage Vpp to the electrical equipment. If one of these voltages is not equal to the expected value, the information obtained at the outputs from the modules 12, 13 and 15 may be wrong.

For example, the values of control signals CLE 1 and CLE 2 could be incorrect if the power supply voltages to modules 12 and 13 are incorrect.

The voltage verification module 14 generates an output signal, the value of which indicates that circuit voltages are or are not conforming to what they should be. For example, the output from the verification module 14 is equal to 1 if all voltages are within their expected nominal range of values.

This verification module 14 can also be used to inhibit values of control signals CLE1 and CLE2 if the voltages are not within their expected nominal range of values.

Finally, the circuit comprises a second verification module 16 with inputs consisting of firstly the output from the comparison module 15 and secondly the output from the first verification 14, and generating a synthetic variable BITE_OK of this information. For example, the second verification module 16 is a logical AND function. Thus for example, the outputs from the comparison module 15 and the first comparison module 14 are equal to 1, and the BITE_OK variable is also equal to 1.

Finally, the circuit also comprises a central data acquisition module 17 to acquire data related to the state of the circuit. These data include some or all of the following data:
  the BITE_OK variable,
  state of control signals CLE 1, CLE 2,
  state of switches Switch1, Switch2 of the first cut off module HW,
  state of the voltage regulator LDO, and
  state of the input signal to the remote communication equipment 2, and
  operating state of the remote communication equipment 2.

The central acquisition module 17 sends said data to the signalling and display device 3 that displays these data, for example by means of light emitting diodes or plain text information on display screens. This enables an operator to immediately detect a malfunction in the electric circuit. The malfunction thus detected can be repaired earlier, and the probability that the equipment 2 is powered when it should not be powered is even further reduced.

The invention claimed is:

1. Electric circuit (1) adapted to controlling an electrical power supply (Vpp) of a piece of electrical equipment (2), the electric circuit (1) comprising electrical equipment (2) and a power supply voltage source (Vpp), and also having at least two discrete electrical signals (DIS 1, DIS 2, DIS 3) as inputs, which values control cutting off of the electrical power supply to the equipment,
  wherein the circuit also comprises:
    a redundant comparison module (11) that compares discrete electrical signals (DIS 1, DIS 2, DIS 3), comprising two comparison branches (12, 13) of said signals in parallel with each other, each branch being adapted to provide an output control signal (CLE1, CLE2) representative of each of the comparisons of said discrete electrical signals, and,
    a first cut off module (HW) that cuts off the electrical power supply to the electrical equipment comprising two switches in series (Switch 1, Switch 2), each being controlled by one of the two control signals (CLE1, CLE2), and
    a second cut off module (FSM) to cut off the electrical power supply of the electrical equipment connected in series between the power supply voltage source (Vpp) of the electrical equipment and the first cut off module HW, and controlled by the two control signals (CLE1, CLE2) provided by the redundant comparison module (11).

2. Electrical circuit (1) according to claim 1, in which the parallel branches (12,13) of the redundant discrete input signals comparison module (11) make a comparison between said signals by the use of a positive logic and a negative logic respectively.

3. Electrical circuit (1) according to claim 1, also comprising a first module (14) to verify the power supply voltage (Vpp) of said circuit (1).

4. Electrical circuit (1) according to claim 1, also comprising a module (15) to compare control signals (CLE1, CLE2) and discrete signals (DISC1-3 Norm, DISC1-3 Redund) from each branch (12, 13).

5. Electrical circuit according to claim 3 or 4, also comprising a second module (16) that verifies outputs from the comparison module (15) and the first module (14) that verifies the voltage and compares control signals and discrete signals, said second verification module (16) having a discrete synthetic variable (BITE_OK) as its output.

6. Electrical circuit (10) according to claim 1, said circuit having three discrete electrical signals (DIS1, DIS2, DIS3) as input.

7. Avionics data acquisition, processing and communication system (10) on board an aircraft, comprising an electric circuit (1) according to claim 1, in which the electrical equipment (2) is an avionics data remote communication module and the discrete input signals (DIS1, DIS2, DIS3) are signals related to the state of said aircraft, the electric circuit (1) being adapted to supply electrical power to the remote avionics data communication module (2) when all electric input signals indicate that said aircraft is stopped and is on the ground.

8. System (10) according to claim 7, in which the electric circuit (1) also comprises a central module (17) for acquisition of at least one of the data among the following group:
- values of control signals CLE1, CLE2 output from the comparison module,
- discrete synthetic value (BITE_OK),
- state of switches (Switch1, Switch2),
- state of the input signal to the remote avionics data communication equipment (2),
- operating state of the remote communication equipment (2),
- the system also comprising a device (3) for signaling data acquired by the central acquisition module.

* * * * *